(12) United States Patent
Lee et al.

(10) Patent No.: US 10,905,000 B2
(45) Date of Patent: Jan. 26, 2021

(54) DISPLAY DEVICE AND METHOD OF MANUFACTURING ELECTRONIC DEVICE USING THE SAME

(71) Applicant: Samsung Display Co., Ltd., Yongin-si (KR)

(72) Inventors: Seung Hyeon Lee, Suwon-si (KR); Yun Ho Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/430,884

(22) Filed: Jun. 4, 2019

(65) Prior Publication Data

US 2019/0380197 A1    Dec. 12, 2019

(30) Foreign Application Priority Data

Jun. 7, 2018 (KR) .................. 10-2018-0065445

(51) Int. Cl.

| | |
|---|---|
| H05K 1/02 | (2006.01) |
| H05K 3/00 | (2006.01) |
| H05K 3/10 | (2006.01) |
| H01L 51/00 | (2006.01) |
| H01L 51/52 | (2006.01) |
| H01L 51/56 | (2006.01) |
| G02F 1/13 | (2006.01) |
| G02F 1/167 | (2019.01) |
| G02F 1/1333 | (2006.01) |
| G02F 1/1368 | (2006.01) |
| H05K 5/00 | (2006.01) |
| H05K 1/18 | (2006.01) |

(52) U.S. Cl.
CPC ............. *H05K 1/028* (2013.01); *H05K 1/189* (2013.01); *H05K 5/0017* (2013.01); *H05K 5/0026* (2013.01); *H05K 2201/10128* (2013.01)

(58) Field of Classification Search
CPC ... H05K 1/02; H05K 3/00; H05K 3/10; H01L 51/00; H01L 51/52; H01L 51/56; G02F 1/13; G02F 1/167; G02F 1/1333; G02F 1/1368
USPC ............. 361/749; 349/58, 59, 149; 345/173, 345/211; 257/40
See application file for complete search history.

(56) References Cited

U.S. PATENT DOCUMENTS

| | | | |
|---|---|---|---|
| 9,568,800 B1* | 2/2017 | Sprague | ............... G02F 1/16753 |
| 2001/0002145 A1* | 5/2001 | Lee | .................... G02F 1/133308 349/58 |
| 2011/0187692 A1* | 8/2011 | Jung | ...................... G09G 3/36 345/211 |

(Continued)

*Primary Examiner* — Xiaoliang Chen
(74) *Attorney, Agent, or Firm* — H.C. Park & Associates, PLC

(57) ABSTRACT

A display device includes a display module, a protective film, and a cover member. The display module includes a non-bending area, and a bending area bent from the non-bending area. The protective film is peelably attached to a bottom surface of the display module, the protection film being configured to be peeled off the bottom surface. The cover member includes a first contact portion coupled to one area of the protective film, a bending protection portion supporting one end of the display module, and a connecting portion having one end connected to the first contact portion and another end connected to the bending protection portion. A planar shape of the first contact portion includes a curved edge.

9 Claims, 16 Drawing Sheets

(56) References Cited

U.S. PATENT DOCUMENTS

| | | | |
|---|---|---|---|
| 2013/0141664 A1* | 6/2013 | Toyoyama | G09F 9/00 |
| | | | 349/59 |
| 2015/0253613 A1* | 9/2015 | Yoon | G02F 1/13452 |
| | | | 349/58 |
| 2016/0066409 A1* | 3/2016 | Kwon | H01L 27/124 |
| | | | 174/254 |
| 2016/0116817 A1* | 4/2016 | Wu | G02F 1/16753 |
| | | | 359/296 |
| 2016/0155788 A1* | 6/2016 | Kwon | H01L 27/3258 |
| | | | 257/40 |
| 2016/0179229 A1* | 6/2016 | Ahn | H01L 27/323 |
| | | | 345/173 |
| 2017/0062481 A1* | 3/2017 | Kim | H01L 27/1218 |
| 2018/0076229 A1* | 3/2018 | Kwon | G02F 1/13452 |
| 2018/0123060 A1* | 5/2018 | Jang | H01L 51/0097 |
| 2018/0180911 A1* | 6/2018 | Odaka | H01L 51/0097 |

\* cited by examiner

DISPLAY DEVICE AND METHOD OF MANUFACTURING ELECTRONIC DEVICE USING THE SAME

CROSS-REFERENCE TO RELATED APPLICATION

This application claims priority from and the benefit of Korean Patent Application No. 10-2018-0065445, filed Jun. 7, 2018, which is hereby incorporated by reference for all purposes as if fully set forth herein.

BACKGROUND

Field

Exemplary embodiments generally relate to a display device and a method of manufacturing an electronic device including the same.

Discussion

A display device, which is a device for displaying an image, typically includes a is display panel, such as an organic light-emitting diode (OLED) display panel, a liquid crystal display (LCD) panel, or the like. The display panel may include a display layer having a plurality of pixels and a touch sensing layer performing a touch sensing function. The display panel may further include a panel flexible printed circuit board (FPCB) to which signals for controlling the display layer are applied and a touch FPCB to which signals for controlling a touch member are applied. The panel FPCB and the touch FPCB may include a bending part. While being delivered, loaded, or installed, the bending part of the display panel can be protected by a cover member attached thereto. However, the cover member may be undesirably separated from the display panel along with a protective film when the protective film is being peeled off.

The above information disclosed in this section is only for understanding the background of the inventive concepts, and, therefore, may contain information that does not form prior art.

SUMMARY

Some exemplary embodiments are capable of providing a cover member having a circular area of contact with a protective film for protecting a surface of a display panel.

Additional aspects will be set forth in the detailed description which follows, and, in part, will be apparent from the disclosure, or may be learned by practice of the inventive concepts.

According to some exemplary embodiments, a display device includes a display module, a protective film, and a cover member. The display module includes a non-bending area, and a bending area bent from the non-bending area. The protective film is peelably attached to a bottom surface of the display module, the protection film being configured to be is peeled off the bottom surface. The cover member includes a first contact portion coupled to one area of the protective film, a bending protection portion supporting one end of the display module, and a connecting portion having one end connected to the first contact portion and another end connected to the bending protection portion. A planar shape of the first contact portion includes a curved edge.

According to some exemplary embodiments, a display device includes a display module, a protective film, and a cover member. The display module includes a non-bending area, and a bending area bent from the non-bending area. The protective film is peelably attached to a bottom surface of the display module, the protection film being configured to be peeled off the bottom surface. The cover member includes a first contact portion coupled to one area of the protective film, a bending protection portion supporting one end of the display module, and a connecting portion having one end connected to the first contact portion and another end connected to the bending protection portion. The first contact portion has a shape of a frustum with a smaller area at a base of the frustum than at a top of the frustum.

According to some exemplary embodiments, a method of manufacturing an electronic device includes providing a display device, which includes a display module, a protective film peelably attached to a bottom surface of the display module, and a cover member including a first contact portion coupled to one area of the protective film; removing the protective film and the cover member from the display device; and coupling the display module to a component of the electronic device. The first contact portion has a circular shape in a plan view.

According various exemplary embodiments, damage to a display panel can be prevented (or at least reduced) when removing a protective film and a cover member. In addition, a bending part of the display panel can be protected.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
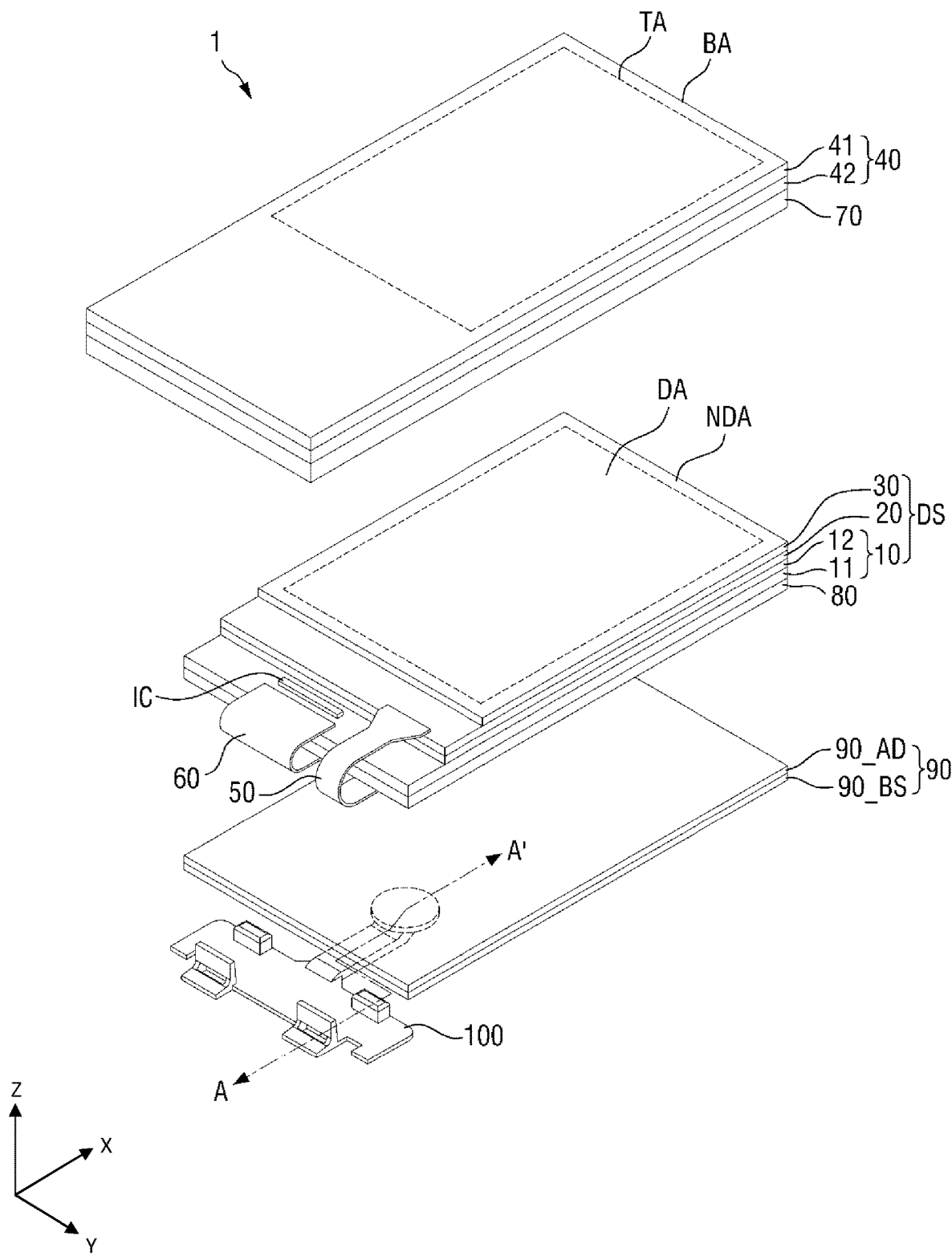
FIG. 1 is an exploded perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "bottom," "lower," "above," "upper," "top," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts Hereinafter, various exemplary embodiments will be explained in detail with reference to the accompanying drawings.

Figure 2:
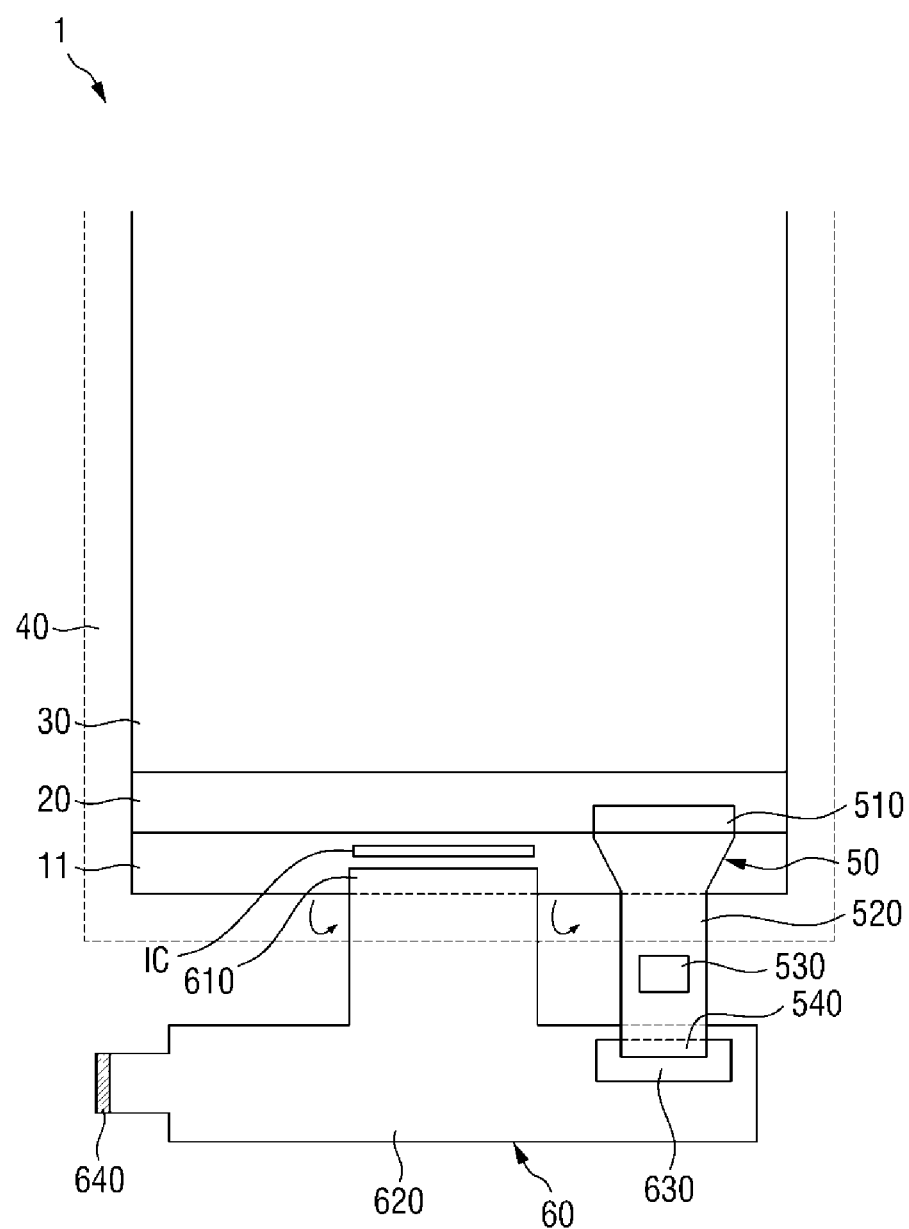
FIG. 2 is a plan view of a portion of the display device of FIG. 1 according to some exemplary embodiments.
Figure 3:
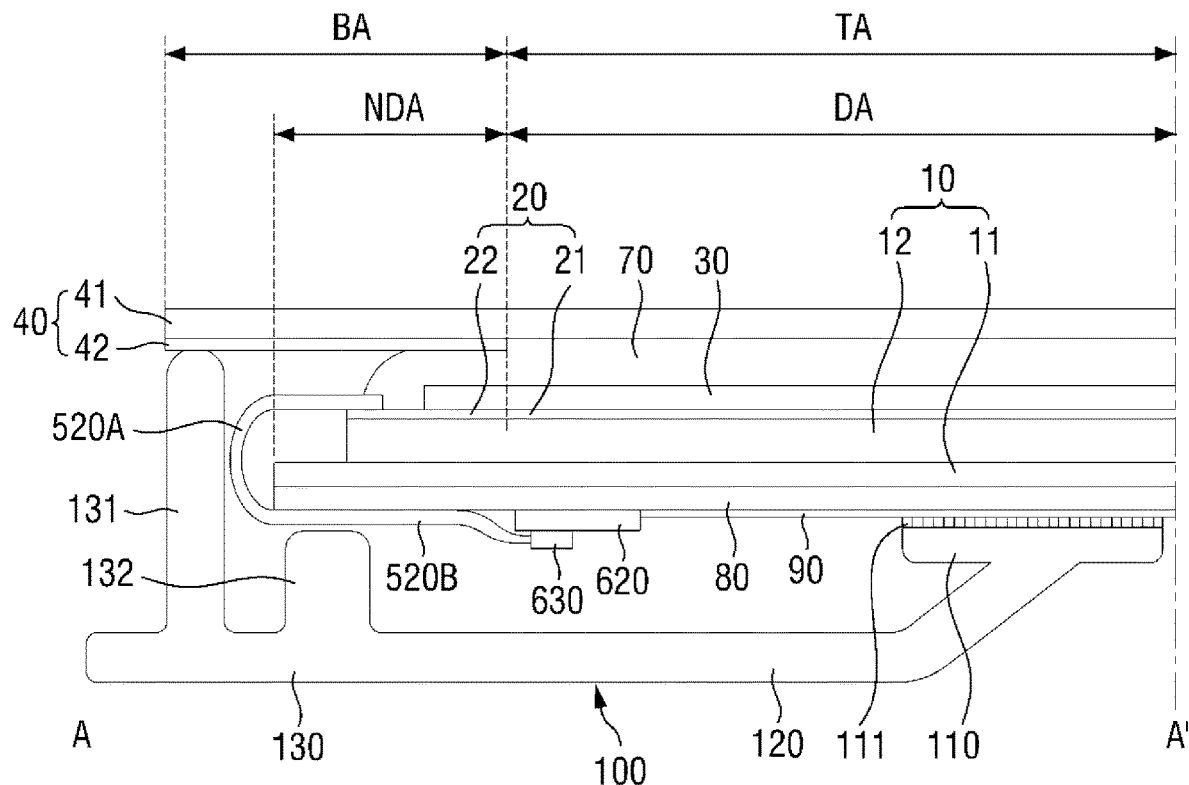
FIG. 3 is a cross-sectional view of the display device of FIG. 1 taken along sectional line A-A' according to some exemplary embodiments.
Figure 4:
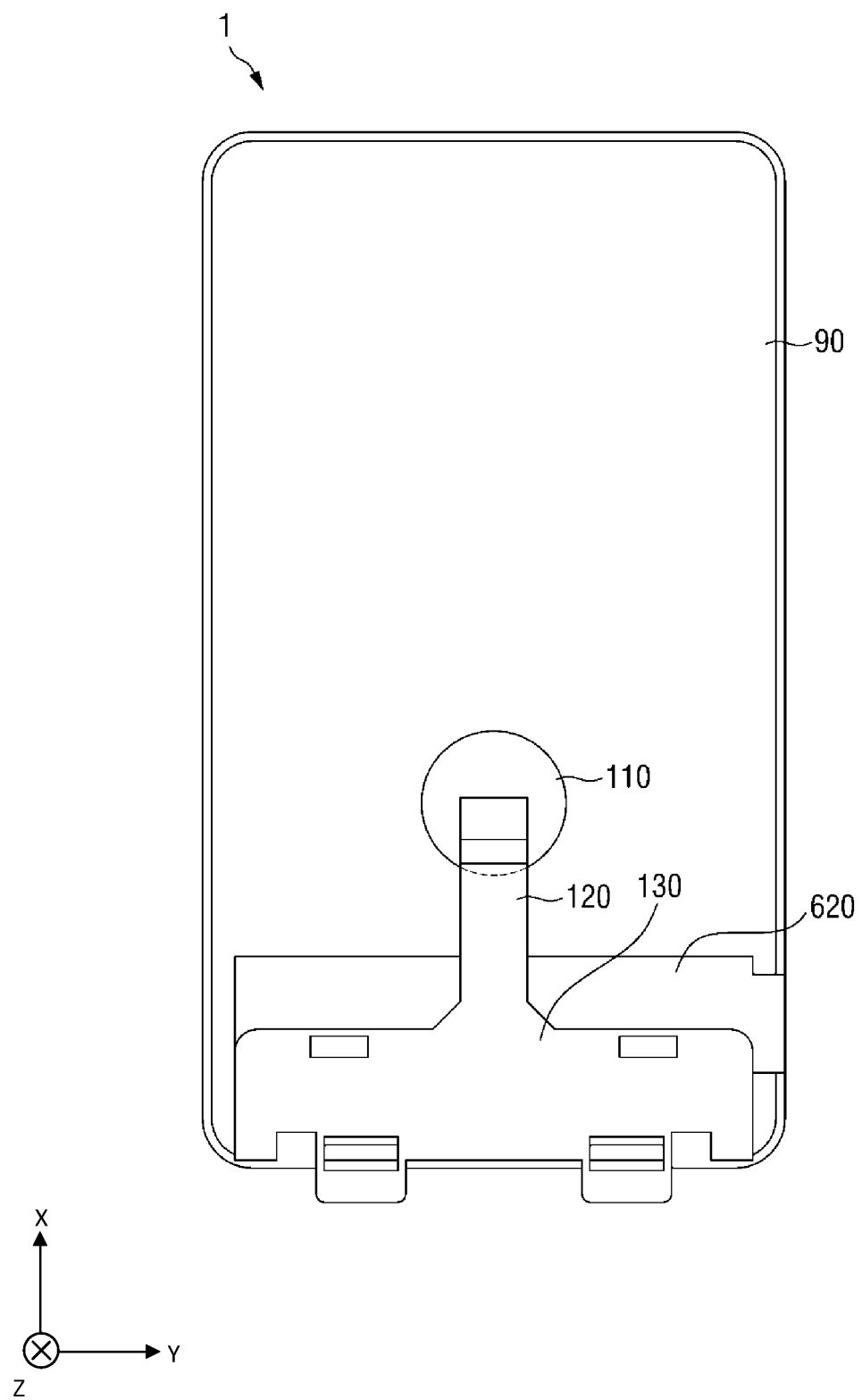
FIG. 4 is a bottom plan view of the display device of FIG. 1 according to some exemplary embodiments.

FIG. 1 is an exploded perspective view of a display device according to some exemplary embodiments. FIG. 2 is a plan view of a portion of the display device of FIG. 1 according to some exemplary embodiments. FIG. 3 is a cross-sectional view of the display device of FIG. 1 taken along sectional line A-A' according to some exemplary embodiments. FIG. 4 is a bottom plan view of the display device of FIG. 1 according to some exemplary embodiments.

Referring to FIGS. 1 through 4, a display device 1 may include a display structure DS, a window structure 40 disposed on the display structure DS, a bonding layer 70 disposed between the window structure 40 and the display structure DS, a touch flexible printed circuit board (FPCB) 50 connected to the display structure DS, a panel FPCB 60 connected to the display structure DS, a display driving unit IC, and a panel protection member 80 disposed below the display structure DS. The display device 1 may further include a protective film 90 disposed below the panel protection member 80 and a cover member 100 coupled to one area of the protective film 90.

The display substrate DS may include a display panel 10 and a touch member 20, as well as may further include an optical member 30.

In some exemplary embodiments, the display panel 10 may have a rectangular shape in a plan view. The display panel 10 may have two long sides extending in a first direction X and two short sides extending in a second direction Y, which intersects the first direction X. A third direction Z may intersect with the first direction X and the second direction Y. The corners at which the long sides and the short sides of the display panel 10 meet may be right-angled, but exemplary embodiments are not limited thereto. For instance, the corners at which the long sides and the short sides of the display panel 10 meet may be rounded. As another example, the corners at which the long sides and the short sides of the display panel 10 meet may be chamfered. The planar shape of the display panel 10 is not particularly limited. For instance, the display panel 10 may have a circular shape or another shape in a plan view.

The display panel 10 has a display area DA and a non-display area NDA. The display area DA is an area in which an image is displayed, and the non-display area NDA is an area in which no image is displayed. In some exemplary embodiments, the non-display area NDA may be disposed outside, e.g., on a periphery of the display area DA, and may surround the display area DA.

Unless specified otherwise, the terms "above," "upper," "top," and "top surface," as used herein, denote a side indicated by an arrow representing the third direction Z, which intersects the first and second directions X and Y, and the terms "below," "lower," "bottom," and "bottom surface," as used herein, denote the opposite side to the side indicated by the arrow representing the third direction Z. However, as previously mentioned, these (and other) spatially relative terms are intended to encompass different orientations of an apparatus in use, operation, and/or manufacture in addition to the orientation depicted in the drawings. Thus, the exemplary term "below" can encompass both an orientation of above and below. Further, the display device 1 may be otherwise oriented (e.g., rotated 90 degrees or at other orientations), and, as such, the spatially relative descriptors used herein interpreted accordingly.

The display panel 10 includes a stack of a first substrate 11, a second substrate 12 disposed on and coupled to the first substrate 11, and a display layer disposed between the first and second substrates 11 and 12.

The first substrate 11 is a substrate supporting the display layer. The first substrate 11 may be formed of glass, a polymer film, such as a plastic film, or the like.

The display layer is disposed on the first substrate 11 in the display area DA. Although not specifically illustrated, the display layer may include a plurality of pixels and a plurality of display signal lines. Each of the pixels may include a thin-film transistor (TFT), a capacitor, and a light-emitting element. The display signal lines may include gate lines transmitting gate signals to the pixels and data lines transmitting data signals to the pixels. The display signal lines may extend from the display area DA to the non-display area NDA.

In the non-display area NDA, the display driving unit IC may be disposed on the first substrate 11. The display driving unit IC may include at least one of a data driver applying data signals to the data lines, a gate driver applying gate signals to the gate lines, and a signal controller controlling operations of the data driver and the gate driver. The display driving unit IC may be electrically connected to the display layer via the display signal lines or other wiring. In some exemplary embodiments, the display driving unit IC may be disposed in the non-display area NDA to be adjacent to one of the short sides of the first substrate 11.

In some exemplary embodiments, the display driving unit IC may be mounted on the first substrate 11. For example, in a case where the first substrate 11 is formed of glass, the display driving unit IC may be mounted on the first substrate 11 in the form of a chip-on-glass (COG). For example, in a case where the first substrate 11 is formed of plastic, the display driving unit IC may be mounted on the first substrate 11 in the form of a chip-on-plastic (COP). However, exemplary embodiments are not limited to these examples. For instance, in another example, the display driving unit IC may be disposed on the panel FPCB 60 or another main printed circuit board (PCB) (not illustrated). The display driving unit IC will hereinafter be described as being mounted on the first substrate 11 in the non-display area NDA.

The second substrate 12 may be an encapsulation substrate preventing (or at least reducing) the penetration of external moisture and/or oxygen into the display panel. The second substrate 12 may be formed of glass or a polymer film, such as a plastic film; however, exemplary embodiments are not limited thereto. The second substrate 12 may be formed to have a smaller size than the first substrate 11 and may cover the first substrate 11 and the display layer in the display area DA. In some exemplary embodiments, the second substrate 12 may be bonded to the first substrate 11 by a sealant (not illustrated) applied along the sides of the second substrate 12. A thin-film encapsulation layer in which at least one organic film and at least one inorganic film are alternately stacked may be provided instead of the second substrate 12.

The touch member 20 may be disposed on the display panel 10. In some exemplary embodiments, the touch member 20 may acquire coordinates of a touch input point in a capacitive manner. The touch member 20 may acquire coordinate information of touch input (or other type of touch interaction) made in a self- or mutual-capacitance manner. The touch member 20 will hereinafter be described as being a mutual-capacitive touch member.

The touch member 20 may have an active area 21 and a non-active area 22. The non-active area 22 may be disposed to surround the active area 21. The active area 21 may overlap with the display area DA of the display panel 10.

The active area 21 may include touch electrodes (not illustrated), and the non-active area 22 may include touch signal lines (not illustrated), which transmit signals to and/or receive signals from the touch electrodes, and pads (not illustrated), which are formed as extensions of the touch signal lines. In some exemplary embodiments, the touch electrodes, the touch signal lines, and the pads of the touch member 20 may be disposed directly above the second substrate 12. In other words, no particular bonding layer (e.g., an adhesive layer) may be disposed between the touch member 20 and the second substrate 12.

The optical member 30 may be disposed on the touch member 20. In some exemplary embodiments, the optical member 30 may include at least one of a phase retarder and a polarizer. In a case where the optical member 30 includes both a phase retarder and a polarizer, the polarizer may be disposed above the phase retarder. The panel protection member 80 may be disposed below the display structure DS.

The panel protection member 80 may include at least one of a buffer member and a heat dissipation member. The buffer member may include a material having a high shock absorption rate. For example, the buffer member may be formed of a polymer resin, such as polyurethane, polycarbonate, polypropylene, or polyethylene, or a foamed sponge obtained from a rubber liquid, a urethane-based material, or an acrylic material, but exemplary embodiments are not limited thereto.

The heat dissipation member may include at least one of graphite, copper (Cu), and aluminum (Al) having excellent heat dissipation characteristics, but exemplary embodiments are not limited thereto. The heat dissipation member not only improves a heat dissipation characteristic, but also has an electromagnetic wave shielding characteristic or an electromagnetic wave absorption characteristic. In some exemplary embodiments, the panel protection member 80 may be coupled to the display structure DS via a separate adhesive layer or a double-sided adhesive tape.

The panel FPCB 60 may be connected to the display panel 10 of the display structure DS. The panel FPCB 60, which is a part to which signals for controlling the display driving unit IC or the display layer are applied, may be coupled to the first substrate 11 in the non-display area NDA.

The panel FPCB 60 may include a first panel substrate portion 610, a second panel substrate portion 620, a connecting portion 630, and an input portion 640.

The first panel substrate portion 610 may be a part of the panel FPCB 60 coupled to the first substrate 11 in the non-display area NDA. The first panel substrate portion 610 may be coupled to pads (not illustrated) provided on the first substrate 11. In some exemplary embodiments, the first panel substrate portion 610 may be coupled to the pads on the first substrate 11 via an anisotropic conductive film, but exemplary embodiments are not limited thereto. For instance, the first panel substrate portion 610 may be connected to the pads on the first substrate 11 through ultrasonic bonding. The first panel substrate portion 610 may be disposed in the non-display area NDA to be adjacent to one of the short sides of the first substrate 11 extending in the second direction Y.

The second panel substrate portion 620 may extend from the first panel substrate portion 610 in the first direction X and may be bent toward the bottom of the display structure DS or the panel protection member 80. That is, the second panel substrate portion 620 may include a bending part extending from the first panel substrate portion 610 and an extension part extending from the bending part and disposed below the display substrate DS or the panel protection member 80.

The connecting portion 630 may be disposed on the second panel substrate portion 620. In some exemplary embodiments, the connecting portion 630 may overlap with the display substrate DS or the panel protection member 80. The connecting portion 630 may be a part to be connected to the touch FPCB 50. In some exemplary embodiments, the connecting portion 630 may be formed as a connector. For example, in a case where a connecting portion 540 of the touch FPCB 50 is formed as a female connector, the connecting portion 630 may be formed as a male connector. In another example, in a case where the connecting portion 540 of the touch FPCB 50 is formed as a male connector, the connecting portion 630 may be formed as a female connector. However, exemplary embodiments are not limited to these examples. For instance, the type of the connecting portion 630 is not particularly limited.

In some exemplary embodiments, the input portion 640, which receives signals from the outside, may be connected to a main PCB (not illustrated). In some exemplary embodiments, the input portion 640 may be a part of the second panel substrate portion 620 or may be disposed on the second panel substrate portion 620.

The touch FPCB 50 may be electrically connected to the touch member 20 of the display structure DS.

The touch FPCB 50 may include a first substrate portion 510 and a second substrate portion 520, and may further include a touch driving portion 530 and a connecting portion 540.

The first substrate portion 510 may be connected to the non-active area 22, which overlaps with the non-display area NDA. In some exemplary embodiments, the first substrate portion 510 may be connected to pads (not illustrated) of the non-active area 22. In some exemplary embodiments, the first substrate portion 510 may be coupled to the non-active area 22 through an anisotropic conductive film, but exemplary embodiments are not limited thereto. For instance, the first substrate portion 510 may be coupled to the non-active area 22 in various manners, such as ultrasonic bonding. In some exemplary embodiments, the first substrate portion 510 may be disposed on the same side as the first panel substrate portion 610, but exemplary embodiments are not limited thereto.

The second substrate portion 520, which extends from the first substrate portion 510, is a part not directly coupled to the touch member 20. The second substrate portion 520 may be bent toward the bottom of the display structure DS of the panel protection member 80. That is, the second substrate portion 520 may include a bending part 520A extending from the first substrate portion 510 and an extension part 520B extending from the bending part 520A. In some exemplary embodiments, when the touch FPCB 50 is in a bent state, the first substrate portion 510 and the extension part 520B may be substantially parallel to each other, and the bending part 520A may be curved.

The bending part 520A may extend from the first substrate portion 510 in the first direction X and may not overlap with the touch member 20 in a plan view. Also, the bending part 520A may overlap with a light-blocking member 42 of the window structure 40. In some exemplary embodiments, the bending part 520A may include a portion whose width in the second direction Y changes in the first direction X. For example, the bending part 520A may include a portion whose width in the second direction Y gradually decreases away from the first substrate portion 510 in the first direction X.

The extension part 520B may extend from the bending part 520A and may be disposed below the display structure DS or the panel protection member 80. In some exemplary embodiments, the extension part 520B may overlap with the non-active area 22 of the touch member 20 and may further overlap with the active area 21 of the touch member 20 or the display area DA of the display panel 10.

The touch driving portion 530 may transmit touch driving signals to the touch member 20. The touch driving portion 530 may process touch sensing signals from the touch member 20 and may generate touch information, such as information regarding the presence and location of a touch input (or interaction). In some exemplary embodiments, the touch driving portion 530 may be mounted on the extension part 520B.

The connecting portion 540 may be provided at the second substrate portion 520. In some exemplary embodiments, the connecting portion 540 may be provided at the extension part 520B of the second substrate portion 520. In some exemplary embodiments, the connecting portion 540 may be connected to the connecting portion 630 of the panel FPCB 60. In this manner, the touch FPCB 50 may receive external signals input through the input portion 640 of the panel FPCB 60 and/or signals generated/processed by circuitry of the panel FPCB 60. In some exemplary embodiments, the connecting portion 540 may be formed as a connector.

The window structure 40 is disposed on the display structure DS and protects the display structure against external impact and scratches. The window structure 40 may include a light-transmitting area TA and a light-blocking area BA. The light-transmitting area TA is an area that transmits light therethrough, and an image provided by the display panel 10 may be provided to a user through the light-transmitting area TA. The light-blocking area BA may be an area that blocks the transmission of light. In some exemplary embodiments, the light-blocking area BA may be disposed near the light-transmitting area TA and may surround the light-transmitting area TA. In some exemplary embodiments, the light-transmitting area TA may overlap with the display area DA of the display panel 10 and may not overlap with the non-display area NDA of the display panel 10. In some exemplary embodiments, the light-blocking area BA may overlap with the non-display area NDA of the display panel 10 and may not overlap with the display area DA of the display panel 10. That is, the light-blocking area BA may cover the non-display area NDA of the display panel 10.

The window structure 40 may include a stack of a window 41 and the light-blocking member 42.

The light-blocking member 42 may be disposed on a first surface of the window 41 facing the display structure DS. The light-blocking member 42 may define the light-blocking area BA of the window structure 40. In some exemplary embodiments, the light-blocking member 42 may be formed as a colored organic layer and may be formed on the first surface of the window 41 through coating or printing. In some exemplary embodiments, the light-blocking member 42 may be formed on a base layer, which is a transparent film, and the base layer may be attached to the first surface of the window 41.

The bonding layer 70 may be disposed between the window structure 40 and the display structure DS, and may couple the window structure 40 and the display structure DS together. The bonding layer 70 may be formed to fill a space between the light-transmitting area TA and the display structure DS. In some exemplary embodiments, the bonding layer 70 may be formed to further fill a space between the light-blocking area BA of the window structure 40 and the display structure DS.

The bonding layer 70 may be in contact with the first surface of the window 41 of the window structure 40. In a case where the optical member 30 is disposed on the touch member 20, the bonding layer 70 may be further in contact with the top surface of the optical member 30.

In some exemplary embodiments, the bonding layer 70 may be further in contact with a part of the non-active area 22 of the touch member 20 that does not overlap with the optical member 30.

In some exemplary embodiments, the bonding layer 70 may be further in contact with the sides and the top surface of the first substrate portion 510 of the touch FPCB 50, which is connected to the non-active area 22. In other words, the bonding layer 70 may further cover parts of the first substrate portion 510. Accordingly, bonding reliability between the first substrate portion 510 and the touch member 20 can be improved.

The protective film 90 and the cover member 100 will, hereinafter, be described.

The protective film 90 may be disposed on a first surface of the display structure DS. The protective film 90 may be attached to the first surface of the display structure DS to protect the display structure DS while the display device 1 is being delivered, loaded, or installed. The protective film 90 may be peeled off and removed when the display device 1 is mounted on an external electronic device. The planar shape of the protective film 90 may be generally the same as the planar shape of the display structure DS.

The protective film 90 may include a film layer 90_BS and an adhesive layer 90_AD. The film layer 90_BS is disposed to overlap with the display structure DS and covers the first surface of the display structure DS. The film layer 90_BS may have the same shape as, or a similar shape to, the display structure DS and may be disposed to overlap with, and cover, the display structure DS.

The film layer 90_BS may be formed of poly(ethylene terephthalate) (PET), polyurethane (PU), polyimide (PI), polycarbonate (PC), polyethylene (PE), polypropylene (PP), polysulfone (PSF), poly(methyl methacrylate) (PMMA), triacetate cellulose (TAC), or a cycloolefin polymer (COP), or a combination of at least two of the aforementioned materials.

The degree to which the film layer 90_BS can be bent may vary depending on the type of the material of, and the thickness of, the film layer 90_BS. The film layer 90_BS of the protective film 90 may have a predetermined bending strength or higher to protect the display structure DS. The curvature of a bending part BD (see FIG. 5A) of the protective film 90 may vary depending on the bending strength of the film layer 90_BS. In some exemplary embodiments, the greater the bending strength of the film layer 90_BS, the greater the curvature of the bending part BD. As the curvature of the bending part BD increases, the repulsive force caused by the bending part BD is dispersed so that the pressure applied to the display structure DS can be reduced.

The adhesive layer 90_AD is disposed on a second surface of the film layer 90_BS and bonds (or attaches) the film layer 90_BS to the first surface of the display structure DS. That is, the film layer 90_BS may be attached to the first surface of the display structure DS via the adhesive layer 90_AD.

The adhesive or bonding force of the adhesive layer 90_AD for the film layer 90_BS is sufficient if it can allow the film layer 90_BS to remain attached to the display structure DS, instead of being peeled off from the display structure DS, while the display device 1 is being stored or being delivered. When the protective film 90 is peeled off, the adhesive layer 90_AD may be separated from the display structure DS while being attached to the film layer 90_BS, and may not remain on the surface of the display structure DS. In this regard, the adhesive force of the adhesive layer 90_AD for the display structure DS may be weaker than the adhesive force of the adhesive layer 90_AD for the film layer 90_BS.

The adhesive layer 90_AD may be formed as a low adhesive layer. For example, the adhesive layer 90_AD may include an acrylic, urethane, or silicone adhesive material.

The cover member 100 may be disposed on the first surface of the display structure DS. The cover member 100 may be attached to the first surface of the display structure DS to protect the bending part 520A of the touch FPCB 50 and the bending area of the panel FPCB 60 while the display device 1 is being delivered or loaded. The cover member 100 may be removed when the display device 1 is mounted on an external electronic device.

The cover member 100 may include a first contact portion 110 coupled to one area of the protective film 90, a bending protection portion 130 supporting one end of the window structure 40, and a connecting portion 120 having one end connected to the first contact portion 110 and the other end connected to the bending protection portion 130.

The first contact portion 110 may include a first adhesive layer 111 disposed on a first surface of the first contact portion 110. The first adhesive layer 111 may couple (or attach) the first contact portion 110 to a first surface of the protective film 90. For instance, the first contact portion 110 may be attached to the first surface of the display structure DS via the first adhesive layer 111.

The adhesive or bonding force of the first adhesive layer 111 for the protective film 90 is sufficient if it can make the protective film 90 removable along with the protective film 90 when the protective film 90 is peeled off. When the protective film 90 is peeled off, the first contact portion 110 may be removed from the display structure DS while being attached to the protective film 90. In this regard, the adhesive force of the first adhesive layer 111 for the protective film 90 may be weaker than the adhesive force of the first adhesive layer 111 for the first contact portion 110.

Figure 5A:
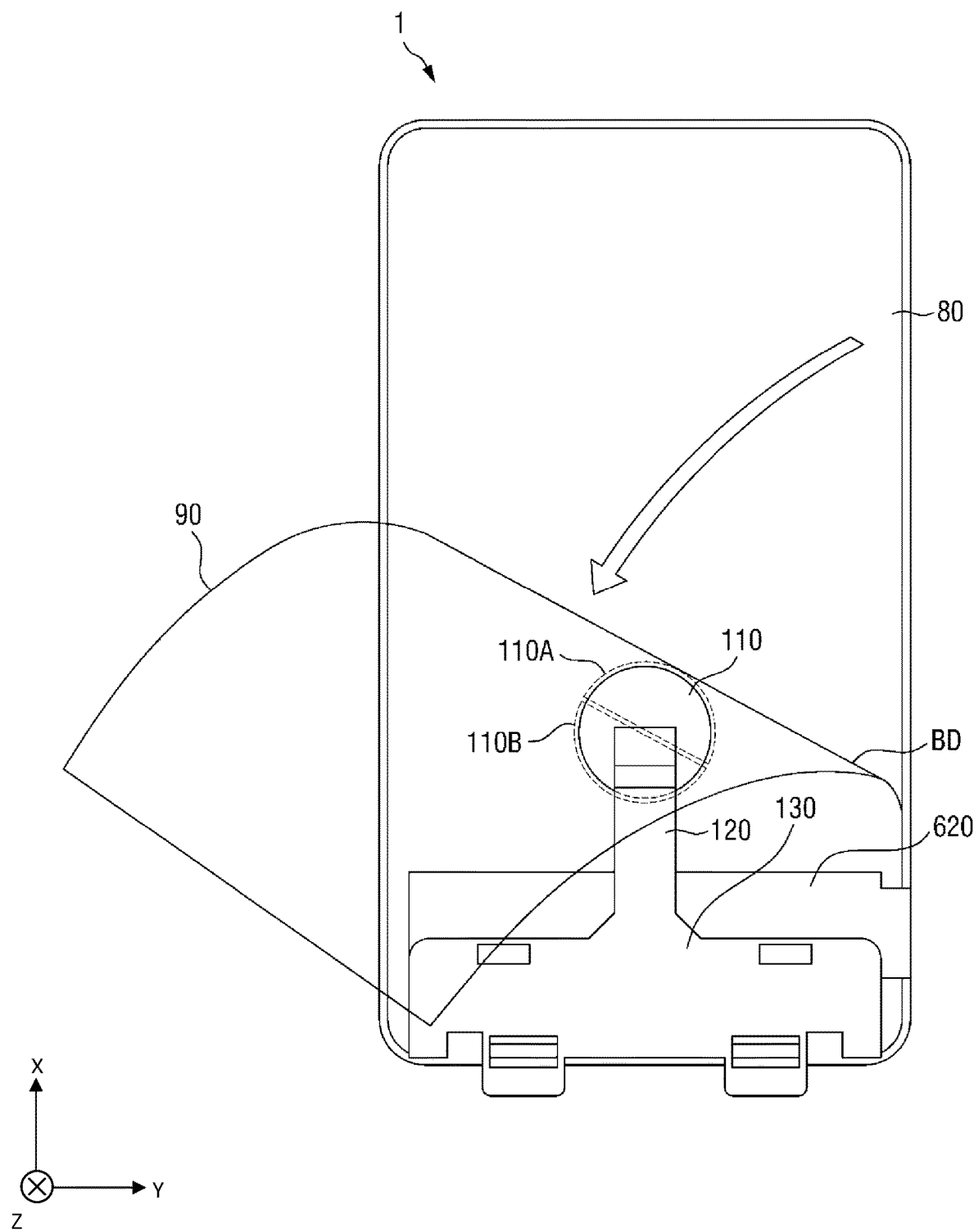
FIGS. 5A and 5B are schematic views illustrating states of the display device of FIG. 1 during and after peeling off of a protective film according to some exemplary embodiments.
Figure 5B:
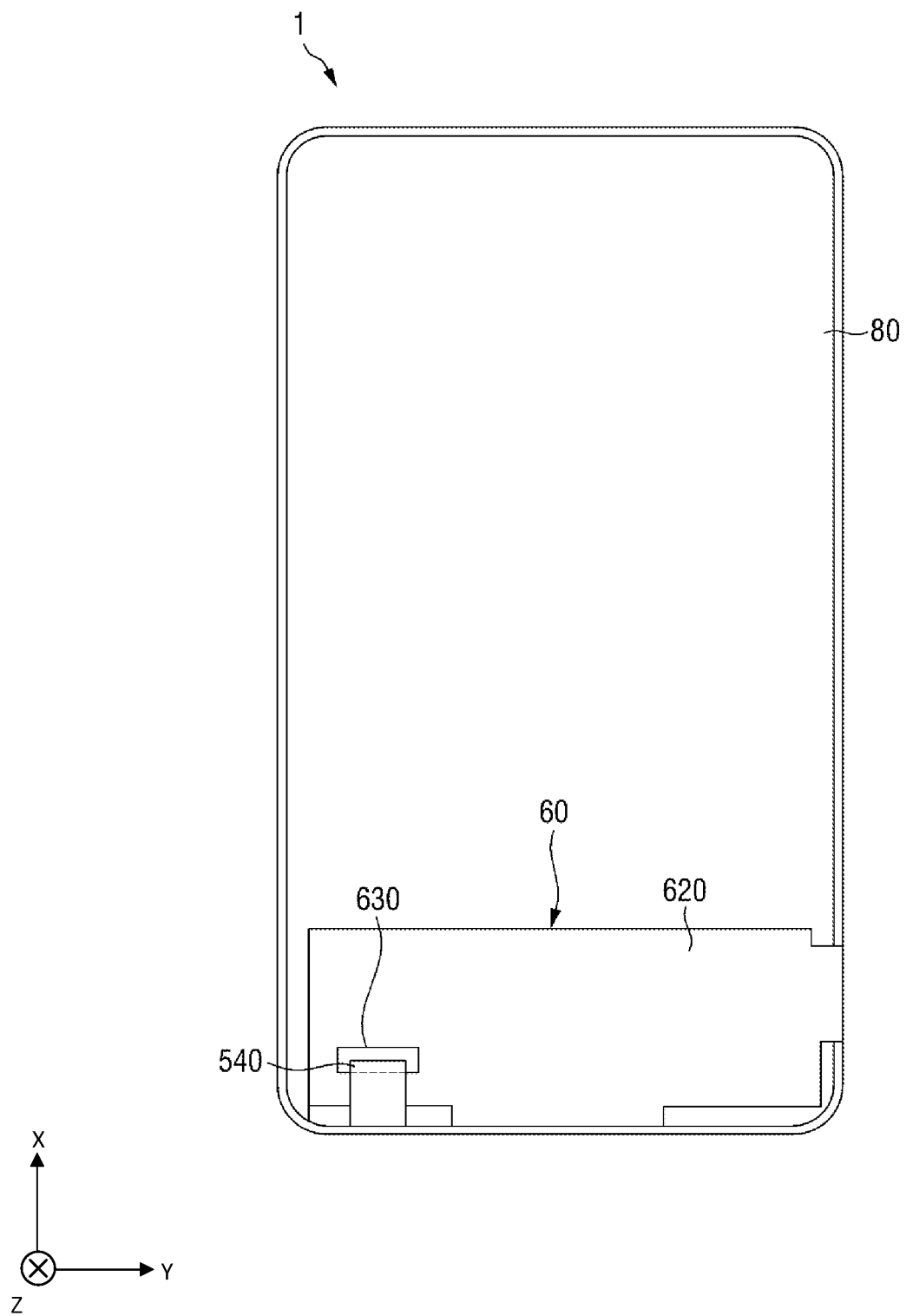

FIGS. 5A and 5B are schematic views illustrating states of the display device of FIG. 1 during and after peeling off of a protective film according to some exemplary embodiments.

Referring to FIG. 5A, the first contact portion 110 may include a first area 110A, which is in contact with the bending part BD of the protective film 90, and a second area 110B, which is pressurized by the bending part BD.

In order to mount the display device 1 in an external electronic device, an operator may peel off the protective film 90 from the display device 1, starting from one of the upper corners of the protective film 90. Generally, a right-handed operator may start peeling off the protective film 90 from the upper right corner of the protective film 90, and a left-handed operator may start peeling off the protective film 90 from the upper left corner of the protective film 90. For convenience, it is assumed that the operator is right-handed.

If the operator starts peeling off the protective film 90 from the upper right corner of the protective film 90, the protective film 90 may be peeled off in a direction toward the lower left corner thereof. A uniform bending part BD may be formed depending on the bending strength of the protective film 90. The bending part BD may be in contact with the first area 110A of the first contact portion 110.

A force applied to the protective film 90, which is coupled to the first contact portion 110, may vary depending on the planar shape of the first area 110A. For example, the first area 110A may be semicircular in shape in a plan view. In a case where the first area 110A has a semicircular shape, a relatively large area of the protective film 90, which is coupled to the first contact portion 110, may uniformly receive the force applied to the protective film 90. On the other hand, if a force is concentrated upon one point on the protective film 90, the protective film 90 may be damaged while being peeled off, and thus, may not be able to be properly peeled off from the display structure DS. Also, the display structure DS may be damaged while the protective film 90 is being peeled off from the display structure DS.

The first contact portion 110 may include the second area 110B, which is pressurized by the bending part BD. The force applied to the protective film 90, which is coupled to the first contact portion 110, may vary depending on the planar shape of the second area 110B. For example, the second area 110B may be semicircular in shape in a plan view. In a case where the second area 110B has a semicircular shape, a relatively large area of the protective film 90, which is coupled to the first contact portion 110, may uniformly receive the force applied to the protective film 90. In other words, a force applied to the display structure DS, which overlaps with the protective film 90 that is coupled to the first contact portion 110, may be distributed. On the other hand, if a force is concentrated upon one point on the protective film 90, the display structure DS, which overlaps with the protective film 90, may be damaged.

The shape of the first and second areas 110A and 110B is not particularly limited. That is, each of the first and second areas 110A and 110B may be a part of a polygon, such as a pentagon, a hexagon, a heptagon, an octagon, etc., or may have a round shape, such as a part of an ellipse.

The first and second areas 110A and 110B may be separated from each other or may be integrally formed. In a case where the first and second areas 110A and 110B are integrally formed, the first contact portion 110 including the first and second areas 110A and 110B may have a circular shape in a plan view. The area of the circular shape of the first contact portion 110 is sufficient if it can uniformly distribute a force applied by the bending part BD when the protective film 90 is being peeled off. For example, when the display panel 10 is 6 inches long, the contact area of the first contact portion 110 may be about 50.3 mm$^2$ to about 78.5 mm$^2$, such as about 36.3 mm$^2$. In a case where the contact surface of the first contact portion 110 has a circular shape in a plan view, the circular shape may have a radius R1 (see, e.g., FIGS. 6 and 7) of 2 mm to 5 mm, such as about 3.4 mm.

Referring to FIG. 5B, when the protective film 90 and the cover member 100 are removed, the panel protection member 80, the connecting portion 540 of the touch FPCB 50, the second panel substrate portion 620, and the connecting portion 630 of the panel FPCB 60 may be at least partially exposed at the bottom of the display device 1.

Referring again to FIGS. 1 through 4, the bending protection portion 130 may be disposed to overlap with the light-blocking area BA of the window structure 40 and the non-display area NDA of the display panel 10. In other words, the bending protection portion 130 may be disposed to overlap with the bending part 520A of the touch FPCB 50 and the bending area of the panel FPCB 60 and to overlap at least partially with the second substrate portion 520 and the second panel substrate portion 620, which are bent toward the bottom of the panel protection member 80.

The bending protection portion 130 may support one area of the window structure 40 through a supporting part 131. The supporting part 131 may be in contact with a first surface of the light-blocking member 42 of the window structure 40. Also, although not specifically illustrated, the supporting part 131 may be in contact with a bottom edge portion of the window structure 40. The bending protection portion 130 may be disposed to be a predetermined distance apart from the bending part 520A of the touch FPCB 50 and the bending area of the panel FPCB 60 in the first direction X.

The bending protection portion 130 may further include a pair of non-bending supporting parts 132. The non-bending supporting parts 132 may support the second substrate portion 520 and the second panel substrate portion 620, which are bent toward the bottom of the panel protection member 80. The non-bending supporting parts 132 may be in contact with first surfaces of the second substrate portion 520 and the second panel substrate portion 620.

Although not specifically illustrated, the non-bending supporting parts 132 may be a predetermined distance apart from the second substrate portion 520 and the second panel substrate portion 620. The non-bending supporting parts 132 may have a rectangular shape in a plan view and may have rounded corners, but exemplary embodiments are not limited thereto. For instance, ends of the non-bending supporting parts 132 may have a semicircular shape.

The connecting portion 120 may have one end connected to the first contact portion 110 and the other end connected to the bending protection portion 130. The connecting portion 120 may be connected to the bending protection portion 130 by extending diagonally to have a predetermined angle with respect to the first direction X and then extending in parallel to the first direction X from a location where its height becomes identical to the height of the bending protection portion 130.

The predetermined angle may be determined by the location of the first contact portion 110 and the height of the bending protection portion 130. The height of the bending protection portion 130 is sufficient if it can allow the cover member 100 to cover the bending part 520A of the touch FPCB 50 and the bending area of the panel FPCB 60 at a predetermined distance from the bending part 520A of the touch FPCB 50 and the bending area of the panel FPCB 60. The first contact portion 110 may be disposed at a location where the protective film 90 can be peeled off and removed at the same time with ease. As the first contact portion 110 is coupled close to the upper end of the protective film 90, a sufficient curvature of the bending part of the film layer 90_BS may not be able to be secured, and as a result, a relatively strong force may be needed to peel off the protective film 90. On the other hand, as the first contact portion 110 is coupled close to the lower end of the protective film 90, a relatively small force may be needed to peel off the protective film 90. In this case, however, since an attractive force may be concentrated upon the edge of the adhesive layer 90_AD by the first contact portion 110, the film layer 90_BS may undesirably be peeled off from the display structure DS while the display device 1 is being stored, delivered, etc.

The connecting portion 120 may be integrally formed together with the first contact portion 110 and the bending protection portion 130. The connecting portion 120 may be formed of a flexible material. As a result, the cover member 100 may be stretched by a predetermined distance in response to external impact and can, thus, effectively protect the bending part of the display device 1.

A method of manufacturing a display device according to some exemplary embodiments will hereinafter be described.

A display device including the window structure 40, the display structure DS, the protective film 90, and the cover member 100, which have been described above with reference to FIGS. 1 through 4, is provided.

The display device may be prepared by coupling the window structure 40 and the display structure DS together with the use of the bonding layer 70 and coupling the panel protection member 80 to the first surface of the display structure DS, and may be provided by attaching the protective film 90 and the cover member 100 to the bottom surface of the panel protection member 80. The display device may be stored or delivered with the protective film 90 and the cover member 100 attached to the bottom surface thereof.

Thereafter, the protective film 90 may be peeled off from the display device. The cover member 100 coupled to the protective film 90 through the first contact portion 110 may be removed along with the protective film 90. As a result, the panel protection member 80 may be exposed at the bottom surface of the display device, and the connecting portion 540 of the touch FPCB 50 and the second panel substrate portion 620 and the connecting portion 630 of the panel FPCB 60 may be at least partially exposed at the bottom surface of the display device.

Thereafter, the display device with the panel protection member 80, the connecting portion 540 of the touch FPCB 50, and the second panel substrate portion 620 and the connecting portion 630 of the panel FPCB 60 exposed at the bottom surface thereof may be subjected to a post-treatment process. The post-treatment process may include, for example, coupling a bracket, but exemplary embodiments are not limited thereto. For instance, the post-treatment process may include coupling an element of an external electronic device and an external case physically coupled to the display structure DS. The element of the external electronic device may be a connector of a motherboard electrically connected to the display structure DS.

Display devices according to various additional and/or other exemplary embodiments will hereinafter be described, focusing mainly on differences with the display device 1 described in association with FIGS. 1 through 4, 5A, and 5B.

Figure 6:
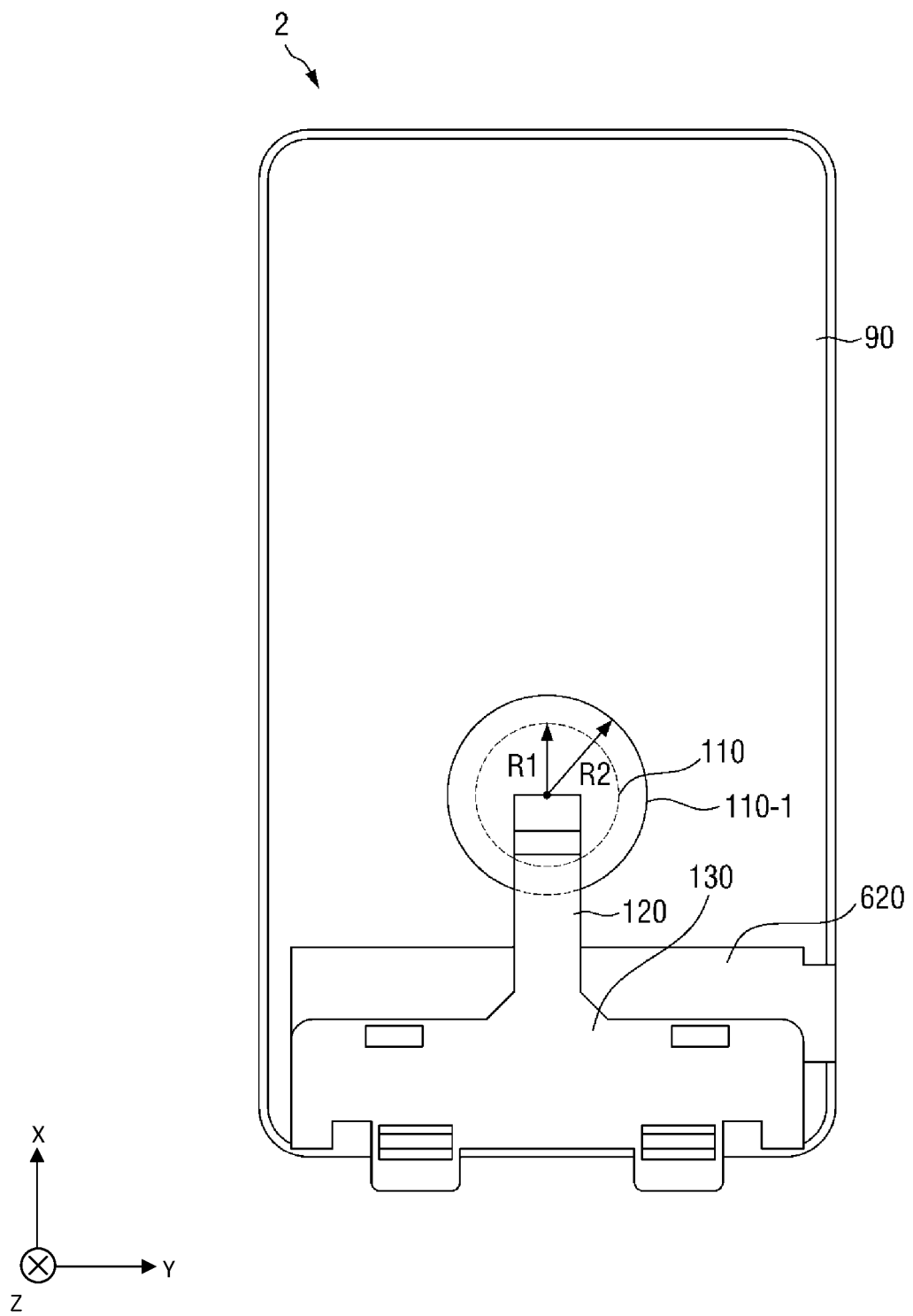
FIGS. 6 and 7 are bottom plan views of display devices according to some exemplary embodiments.
Figure 7:
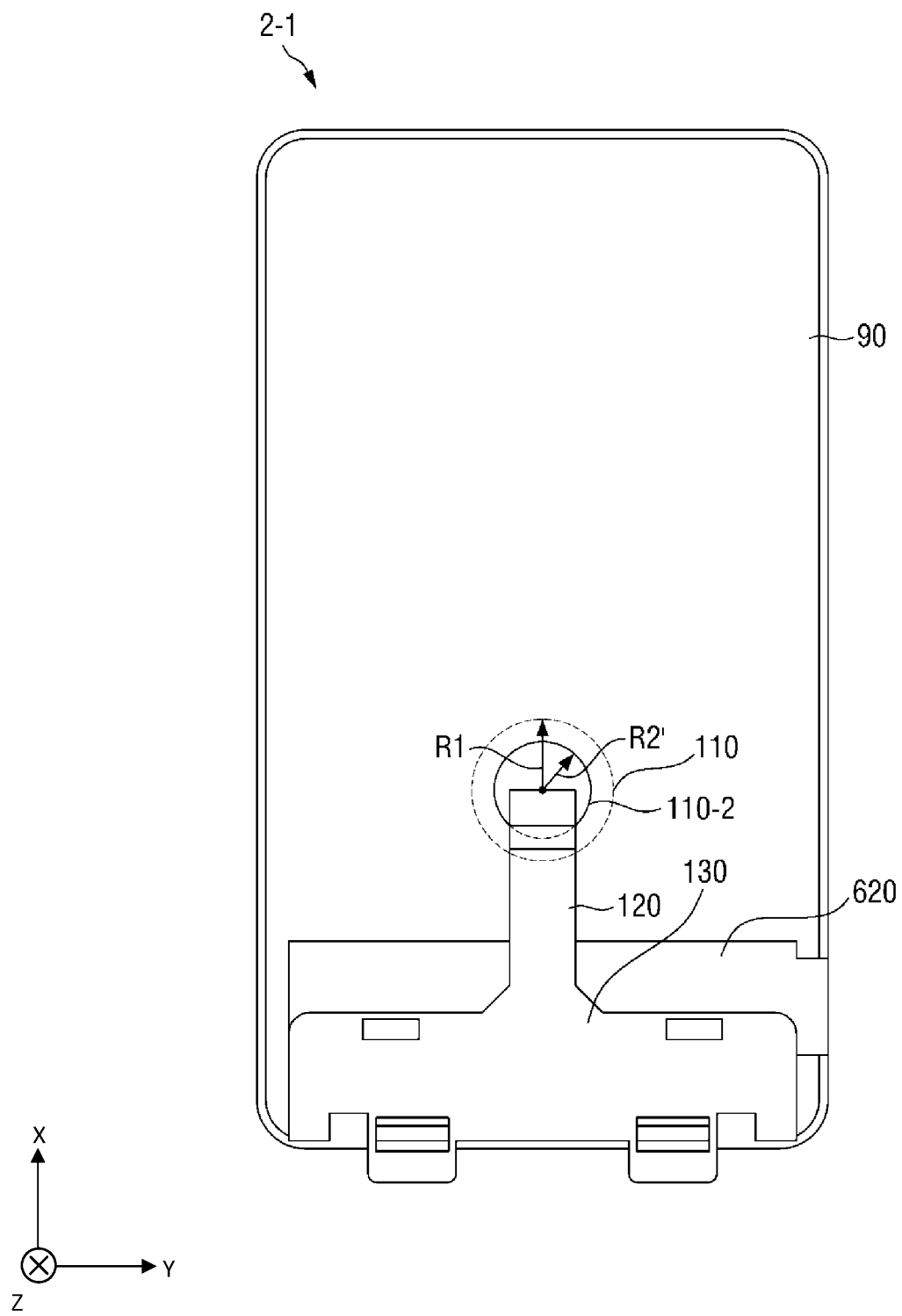

FIGS. 6 and 7 are bottom plan views of display devices according to some exemplary embodiments.

Referring to FIGS. 6 and 7, display devices 2 and 2-1 differ from the display device 1 of FIGS. 1 through 4 in that first contact portions 110-1 and 110-2 have a larger or smaller area than the first contact portion 110 of FIG. 4.

For instance, the area of the first contact portion 110-1 of FIG. 6 may be larger than the area of the first contact portion 110 of FIG. 4. The first contact portion 110-1 may have a circular shape in a plan view. The first contact portion 110-1 may have a circular shape in a plan view, and the circular shape may have a radius R2 of about 5 mm. Since the area of the first contact portion 110-1 is increased as compared to the area of the first contact portion 110, the first contact portion 110-1 can be firmly coupled to a protective film 90. That is, the first contact portion 110-1 can be firmly coupled to a display structure DS. Also, pressure generated by a curvature of bending part BD, which is formed when the protective film 90 is being peeled off, can be effectively distributed by the first contact portion 110-1, which has an increased area.

The area of the first contact portion 110-2 of FIG. 7 may be smaller than the area of the first contact portion 110 of FIG. 4. The first contact portion 110-2 may have a circular shape in a plan view, and the circular shape may preferably have a radius R2' of about 2 mm. Since the area of the first contact portion 110-2 is reduced as compared to the area of the first contact portion 110 of FIG. 4, the weight of a cover member 100 can be reduced, and the manufacturing cost of the display device 2-1 can be reduced. However, since the area of the first contact portion 110-2 is reduced as compared to the area of the first contact portion 110 of FIG. 4, the bonding force of the first contact portion 110-2 for a protective film 90 may undesirably be reduced. Accordingly, the first contact portion 110-2 may be only meaningful if a supporting part 131 of a bending protection portion 130 further increases a second adhesive layer or further includes a coupler engaged with one end of a window structure 40.

Figure 8:
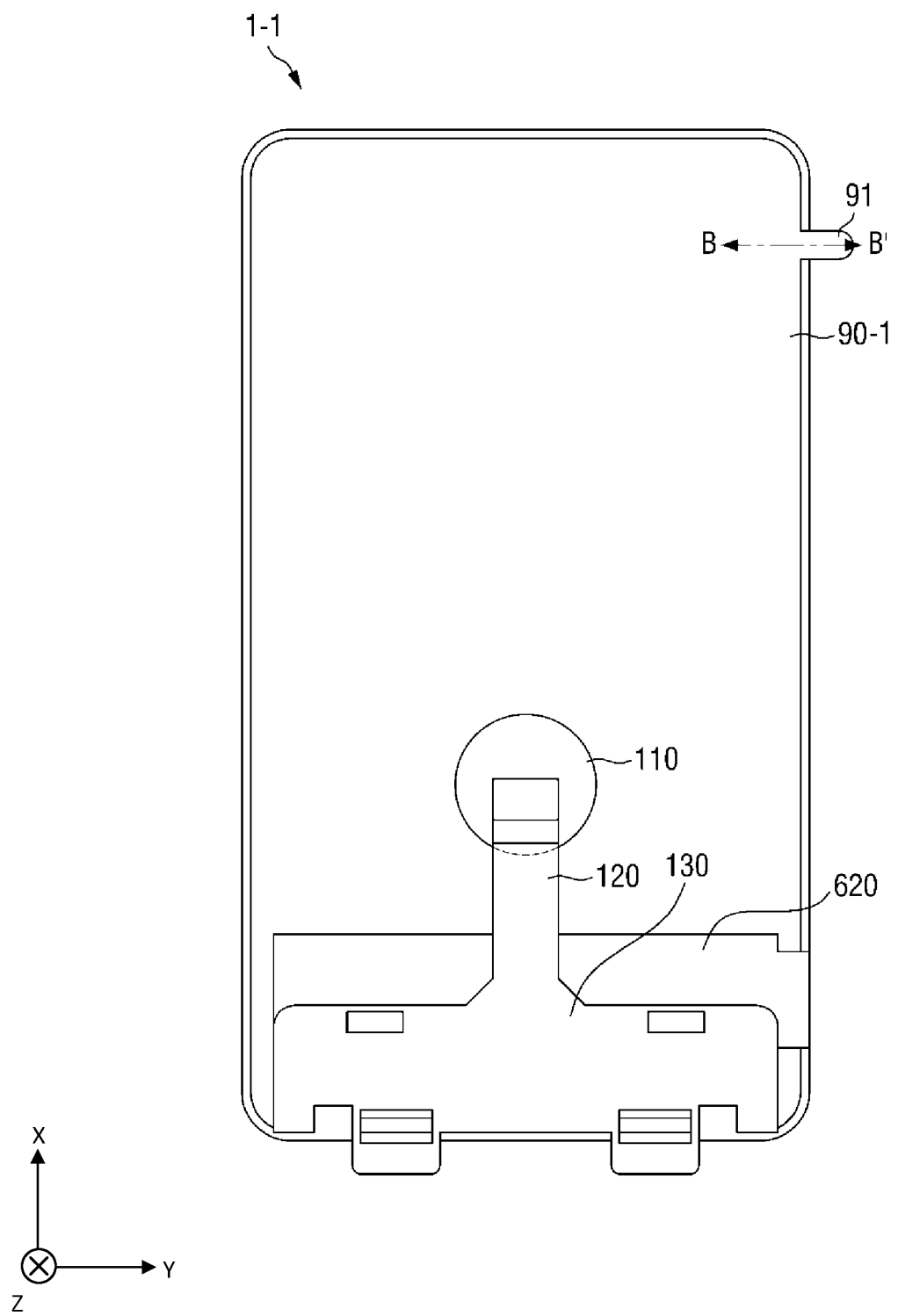
FIG. 8 is a bottom plan view of a display device according to some exemplary embodiments.
Figure 9:
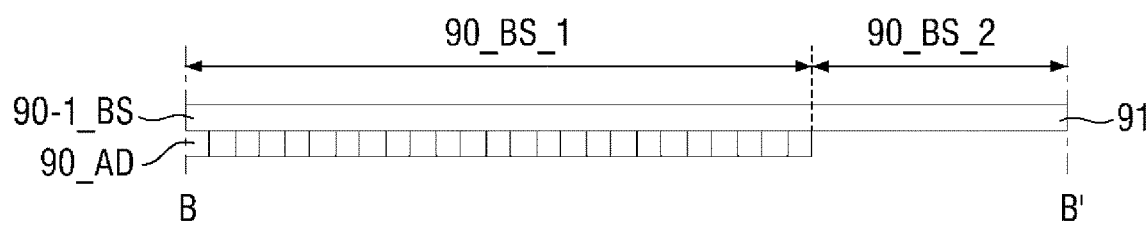
FIG. 9 is a cross-sectional view of the display device of FIG. 7 taken along sectional line B-B' according to some exemplary embodiments.

FIG. 8 is a bottom plan view of a display device according to some exemplary embodiments. FIG. 9 is a cross-sectional view of the display device of FIG. 7 taken along sectional line B-B' according to some exemplary embodiments.

Referring to FIGS. 8 and 9, a protective film 90-1 differs from the protective film 90 of FIG. 4 in that it further includes a pull tab portion 91.

For instance, the pull tab portion 91 may be disposed at an upper part of the right side of a film layer 90-1_BS and may protrude outwardly beyond a window structure 40. Thus, the pull tab portion 91 can allow the protective film 90-1 to be easily grabbed when the protective film 90-1 is peeled off from a display structure DS. Accordingly, the protective film 90-1 can be quickly peeled off.

The pull tab portion 91 is illustrated as being disposed at an upper right side of the protective film 90-1, but the number and the location of pull tab portion(s) 91 provided are not particularly limited. A first contact portion 110 may have a circular shape. Thus, pressure applied by a curvature of a bending part BD to a second area 110B can be effectively distributed regardless of the location of the pull tab portion 91 and the direction in which the protective film 90-1 is peeled off.

As illustrated in FIG. 9, the pull tab portion 91 may be integrally formed with the film layer 90-1_BS. A first area 90_BS_1 of the film layer 90-1_BS may overlap with an adhesive layer 90_AD, but a second area 90_BS_2, which corresponds to the pull tab portion 91, may not overlap with the adhesive layer 90_AD. Although not specifically illustrated, the pull tab portion 91 may be formed as a separate element from the film layer 90-1_BS. For example, a film layer for forming the pull tab portion 91 may be attached to a first surface of the film layer 90-1_BS.

Figure 10:
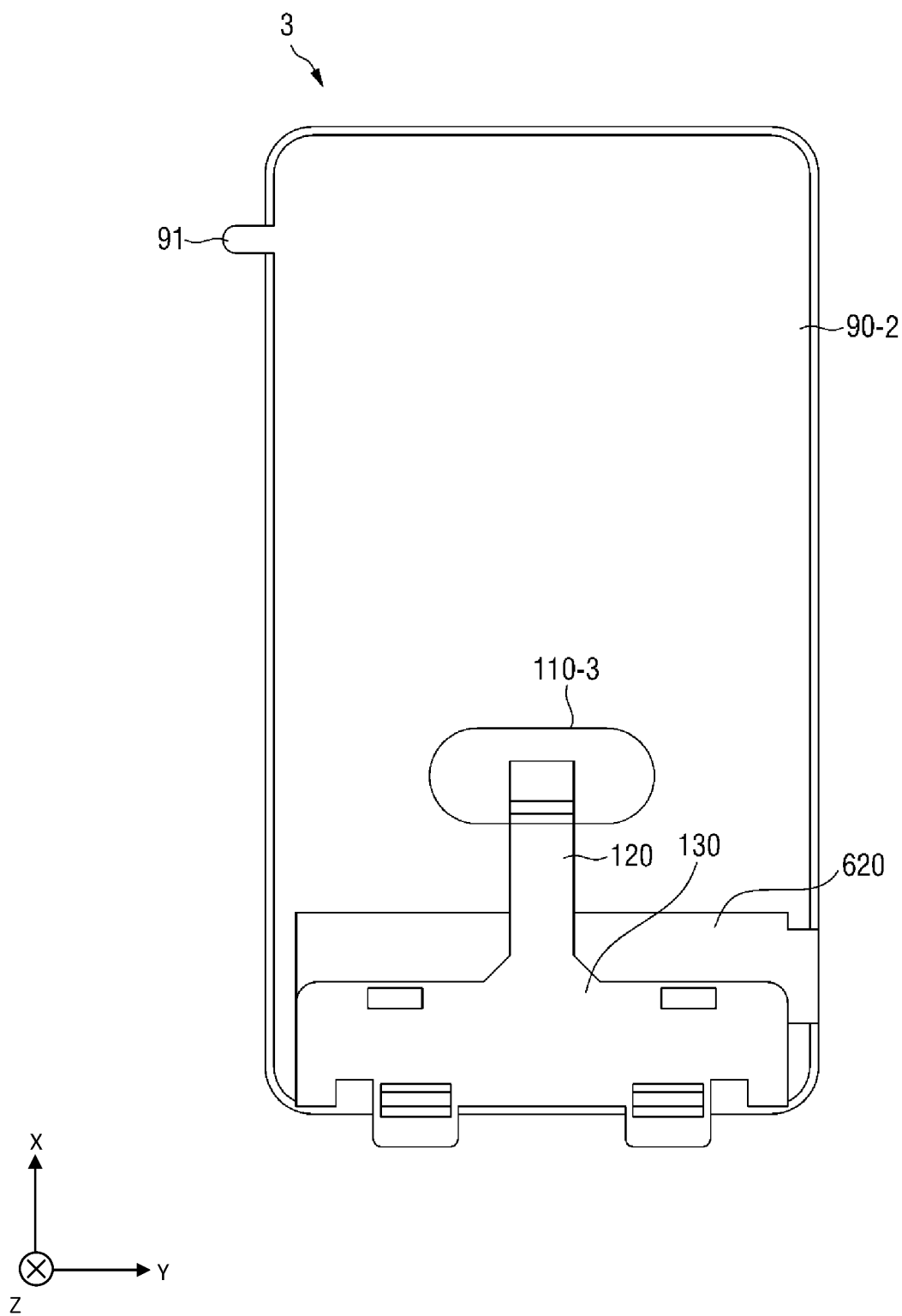
FIGS. 10 and 11 are bottom plan views of display devices according to some exemplary embodiments.
Figure 11:
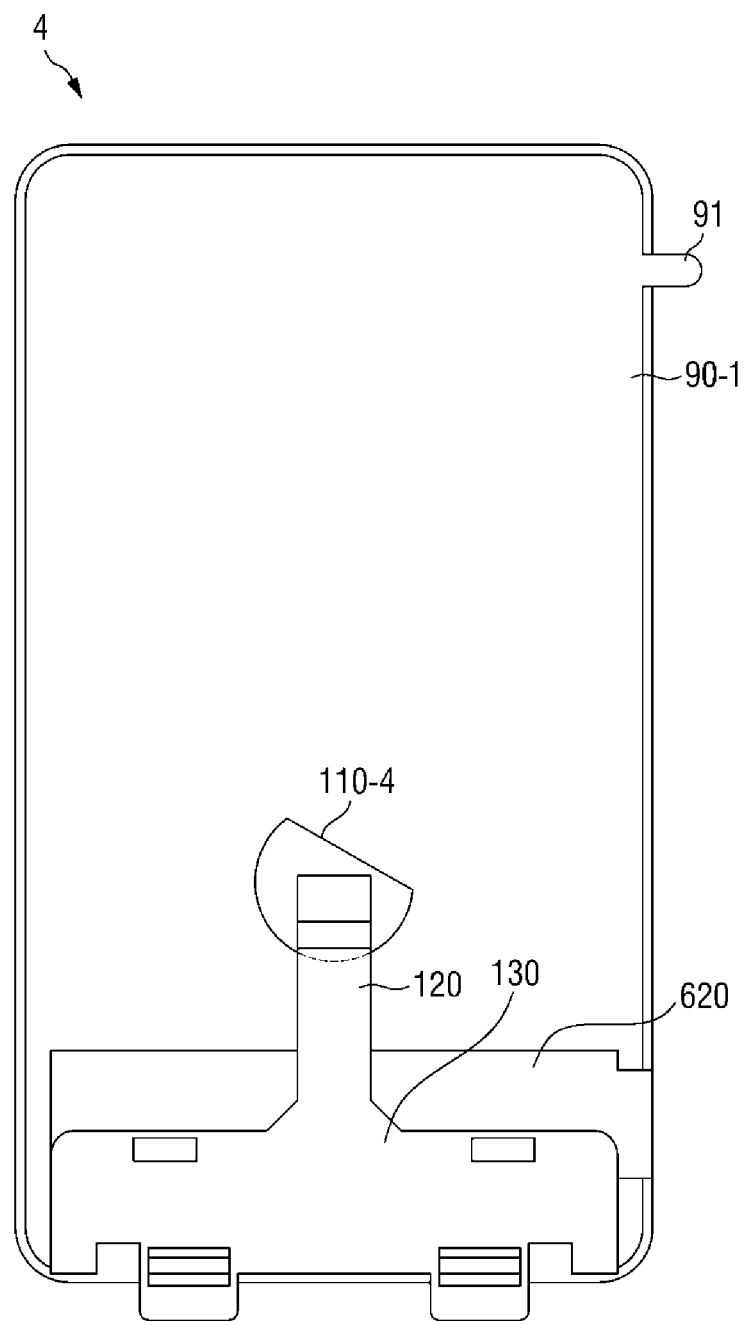

FIGS. 10 and 11 are bottom plan views of display devices according to some exemplary embodiments.

Referring to FIG. 10, a display device 3 differs from the display device 1-1 of FIG. 8 in the planar shape of a first contact portion 110-3 and a location of the pull tab 91 of the protective film 90-2.

For example, the first contact portion 110-3 may have an elliptical shape in a plan view. That is, the first contact portion 110-3 may have a shape obtained by rounding both short sides of a rectangle into an ellipse. For instance, the radius of the contact surface of the first contact portion 110 of FIG. 8, which has a circular shape, may be increased in a concentric manner, but the area of the first contact portion 110-3, which has an elliptical shape, may be increased in a lengthwise direction. As a result, the area of the contact surface of the first contact portion 110-3 can be selectively increased.

A pull tab portion 91 may be disposed at an upper part of the left side of a protective film 90-2, e.g., of a corresponding film layer of the protection film 90-2, but the number and the location of pull tab portions 91 provided are not particularly limited. Also, the pull tab portion 91 may not be provided.

Referring to FIG. 11, a display device 4 differs from the display device 3 in the planar shape of a first contact portion 110-4.

For example, the first contact portion 110-4 may have a semicircular shape in a plan view. That is, a second area 110B of the first contact portion 110-4 may have a semicircular shape. However, the shape of the first contact portion 110-4 is not particularly limited. That is, alternatively, the first contact portion 110-4 may have a shape obtained by cutting off a part of a circle. As a result, since the edge of a first area 110A of the first contact portion 110-4 can be disposed in parallel to a curvature of bending part BD when a protective film 90-1 is being peeled off, damage to the protective film 90-1 can be prevented.

A pull tab portion 91 may be disposed at an upper part of the right side of a protective film 90-1, and a second area 110B of the first contact portion 110-4, which is semicircular in shape, may be disposed to correspond to the pull tab portion 91. However, exemplary embodiments are not limited to these examples. For instance, the first contact portion 110-4 may be disposed in such a manner that an extension of the diameter of the first contact portion 110-4 can be substantially orthogonal to the direction in which the protective film 90-1 is peeled off. For example, in a case where the pull tab portion 91 is disposed at an upper part of the left side of the protective film 90-2 (see, e.g., FIG. 10), the first contact portion 110-4 may be arranged in a mirror symmetrical manner to that illustrated in FIG. 11.

Figure 12:
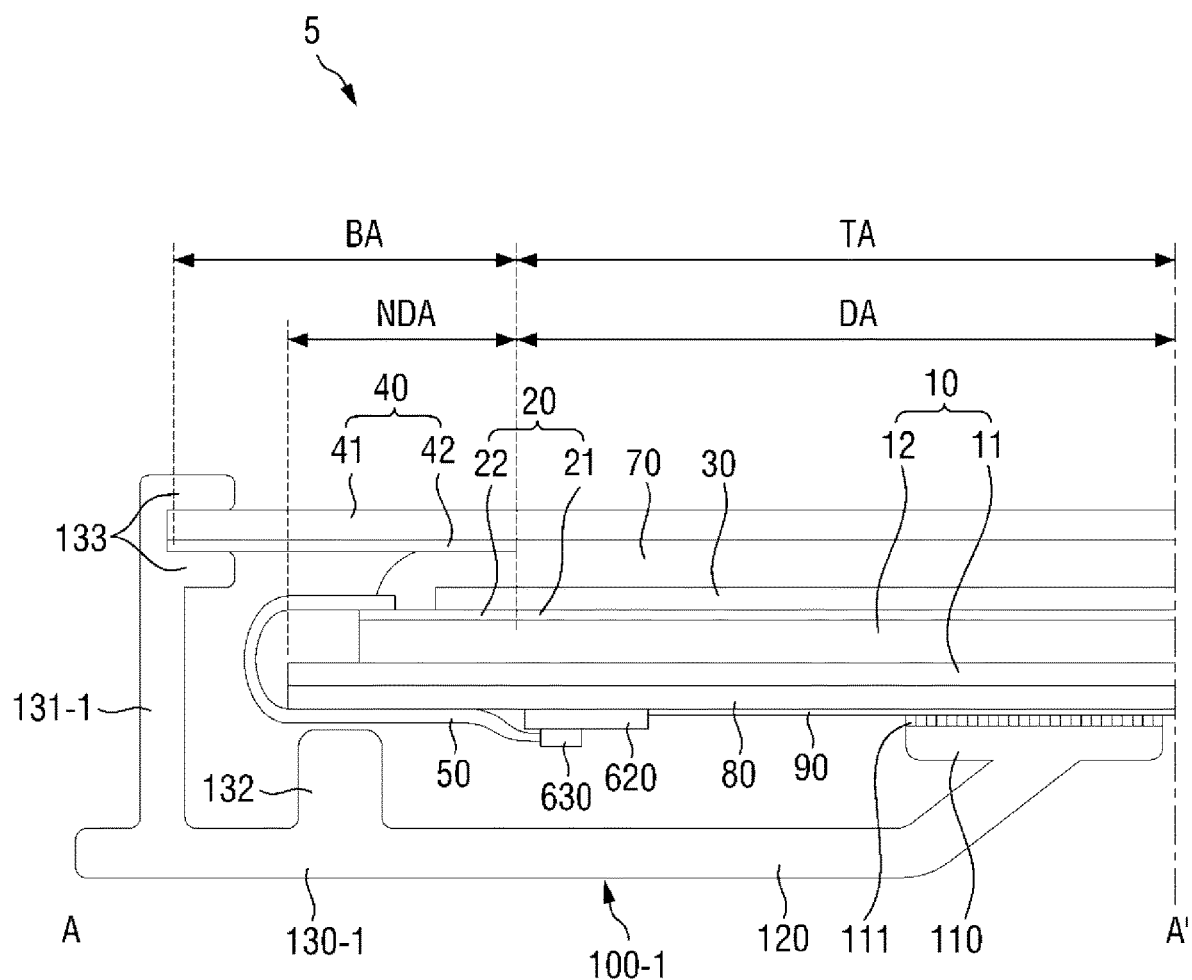
FIGS. 12 and 13 are cross-sectional views of display devices taken along sectional line A-A' of FIG. 1 according to some exemplary embodiments.

FIG. 12 is a cross-sectional views of a display device taken along sectional line A-A' of FIG. 1 according to some exemplary embodiments.

Referring to FIG. 12, a display device 5 differs from the display device 1 of FIG. 3 in that a supporting part 131-1 of a bending protection portion 130-1 of a cover member 100-1 further includes a coupler 133.

For example, the coupler 133 may be provided at one end of the supporting part 131-1 and may be engaged with one end of a window structure 40. The coupler 133 may have a U shape in a cross-sectional view. The coupler 133 may be integrally formed with the supporting part 131-1 or may be coupled to the supporting part 131-1. In order to prevent (or reduce) damage to the window structure 40, the coupler 133 may include a cushion layer (not illustrated). Accordingly, a protective film 90 can be firmly attached to a display structure DS without being separated from the display structure DS when the display device 5 is being stored, delivered, etc., as compared to when the protective film 90 is attached to the display device 5 solely through a first contact portion 110.

A non-bending supporting part 132 is illustrated as being in contact with a first surface of a touch FPCB 50, but may be a predetermined distance apart from the touch FPCB 50.

Figure 13:
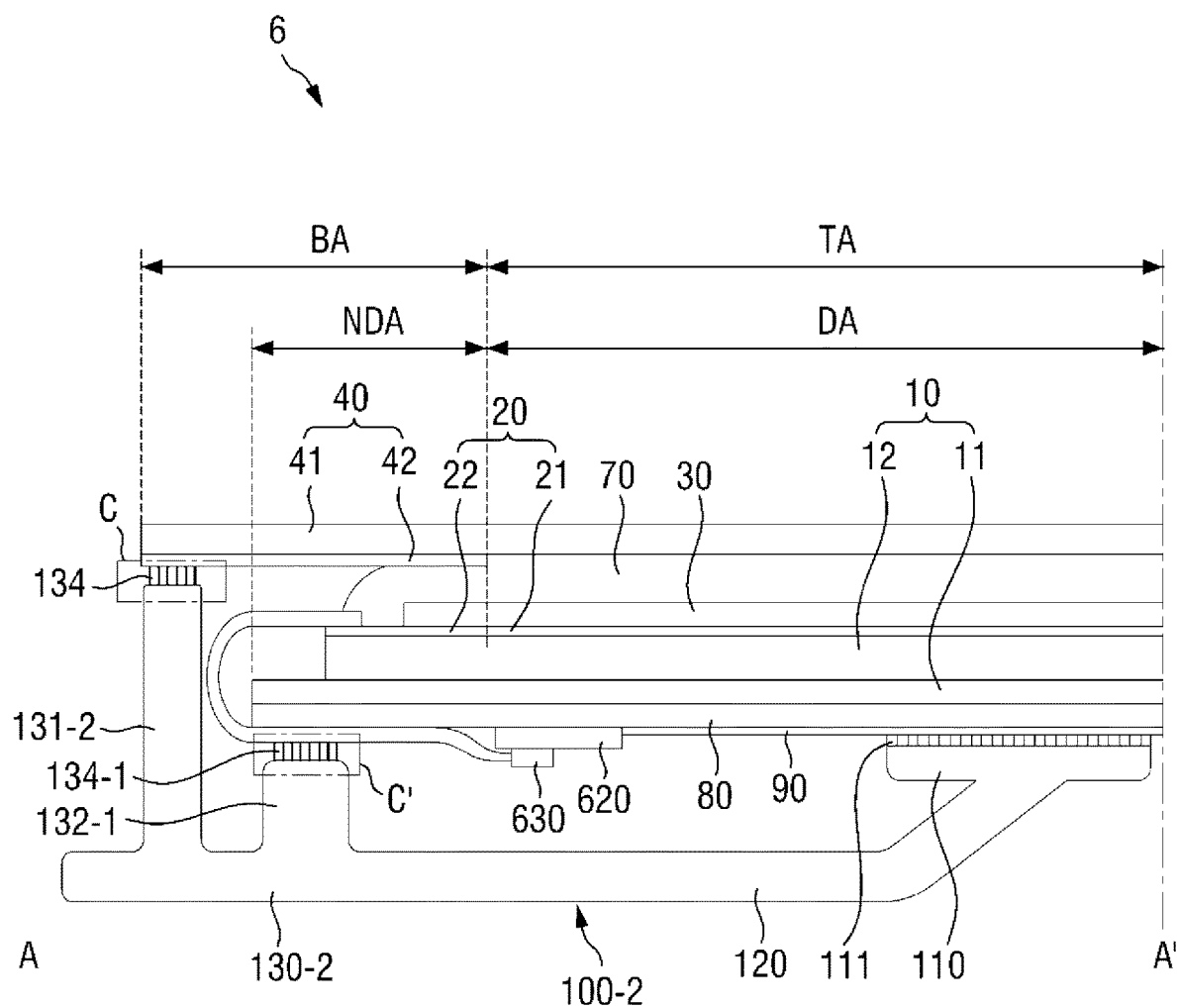
Figure 14:
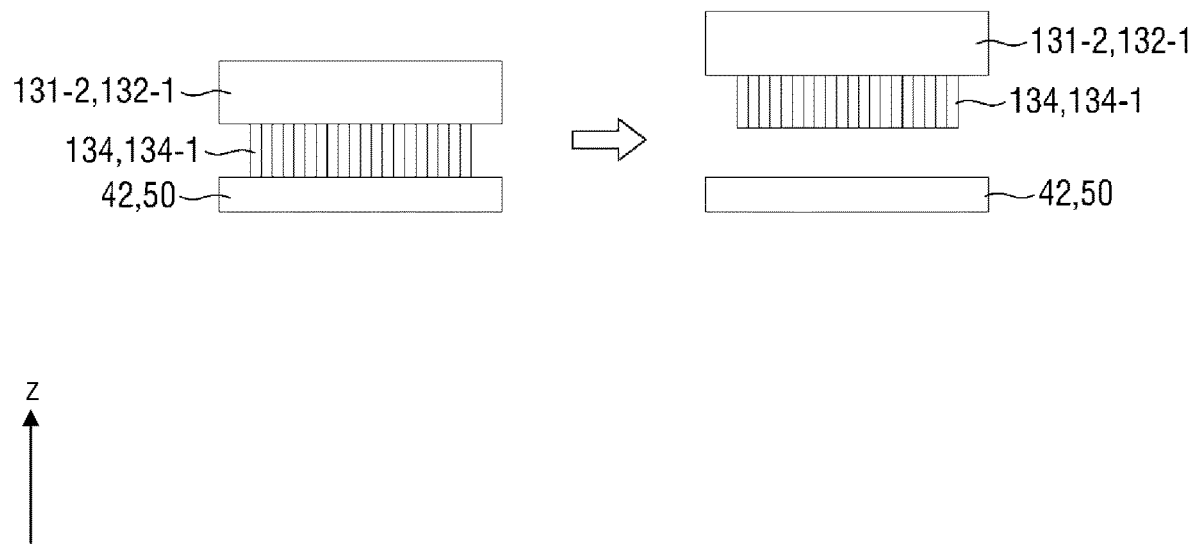
FIG. 14 is an enlarged cross-sectional view of part C or C' of the display device of FIG. 13 according to some exemplary embodiments.

FIG. 13 is a cross-sectional views of a display device taken along sectional line A-A' of FIG. 1 according to some exemplary embodiments. FIG. 14 is an enlarged cross-sectional view of part C or C' of the display device of FIG. 13 according to some exemplary embodiments.

Referring to FIGS. 13 and 14, a supporting part 131-2 and a non-bending supporting part 132-1 of cover member 100-2 differ from their respective counterparts in FIG. 3 in that they include second adhesive layers 134 and 134-1, respectively.

For instance, the second adhesive layer 134 may be disposed at one end of the supporting part 131-2 of bending protection portion 130-2, and the second adhesive layer 134-1 may be disposed at one end of the non-bending supporting part 132-1 of bending protection portion 130-2. The adhesive or bonding force of the second adhesive layers 134 and 134-1 for a light-blocking member 42 of a window structure 40 and/or a first surface of a touch FPCB 50 may be sufficient if it can allow the second adhesive layers 134 and 134-2 to remain attached to the light-blocking member 42 of the window structure 40 and/or the first surface of the touch FPCB 50, instead of being separated from the window structure 40 and/or the touch FPCB 50, when a display device 6 is being stored, delivered, or the like. When a bending protection portion 130-2 is removed, the second adhesive layer 134 may be removed from the light-blocking member 42 and/or the touch FPCB 50 while being attached to the supporting part 131-2 and/or the non-bending supporting part 132-1, and may not remain on the surface of the light-blocking member 42 and/or the surface of the touch FPCB 50. In this regard, the bonding force of the second adhesive layers 134 and 134-1 for the light-blocking member 42 and/or the touch FPCB 50 may be weaker than the bonding force of an adhesive layer 90_AD for the light-blocking member 42 and/or the touch FPCB 50.

Figure 15:
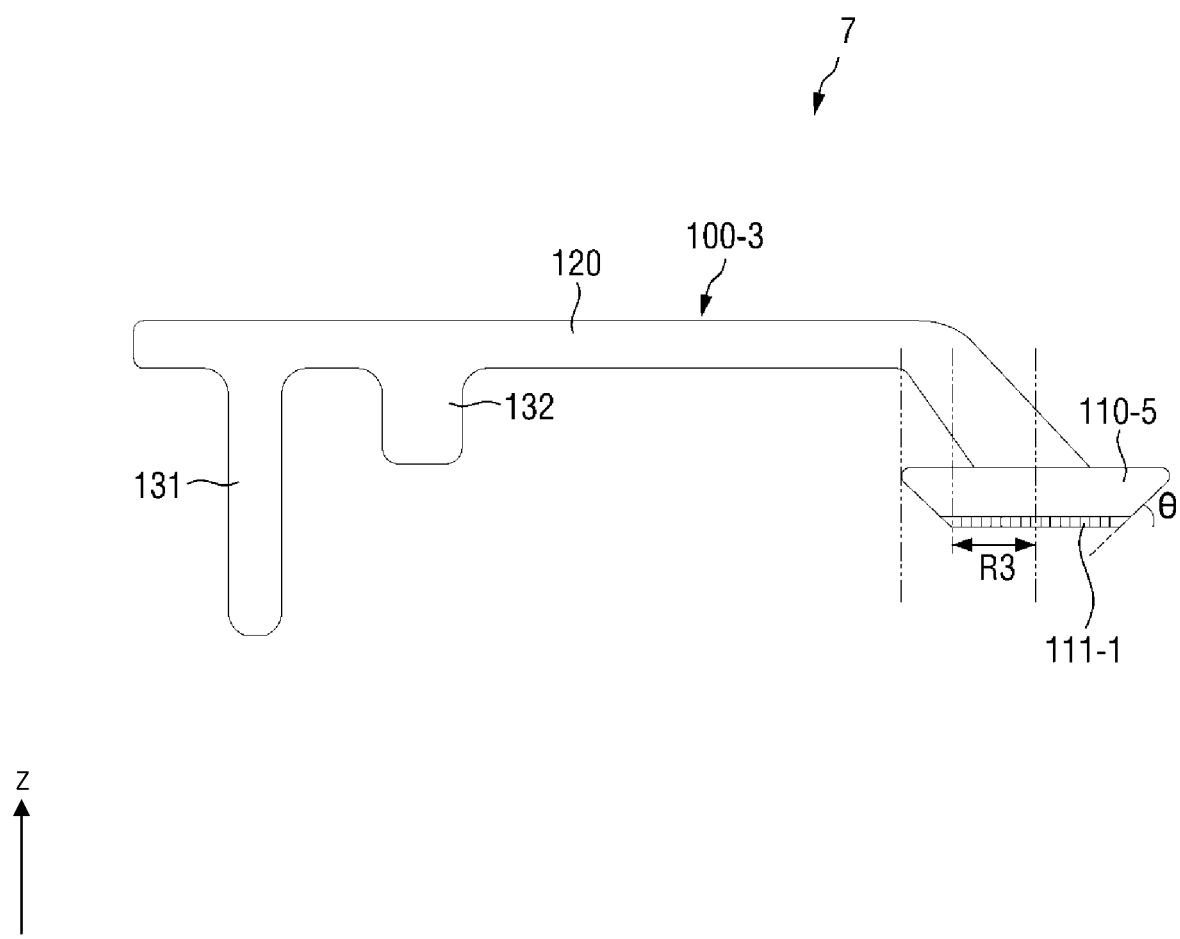
FIG. 15 is a cross-sectional view of a cover member according to some exemplary embodiments.

FIG. 15 is a cross-sectional view of a cover member according to some exemplary embodiments.

Referring to FIG. 15, a cover member 100-3 differs from the cover member 100 of FIG. 3 in that a first contact portion 111-1 has the shape of a frustum of a cone or pyramid with a smaller area at the base thereof than at the top thereof.

Specifically, a first surface of the first contact portion 111-1 and the top surface of a protective film 90 may be coupled together. The sides of the first contact portion 111-1 and the top surface of the protective film 90 may form a predetermined angle θ. Due to the predetermined angle θ formed between the sides of the first contact portion 111-1 and the top surface of the protective film 90, ramps may be formed on the sides of the first contact portion 111-1. When the protective film 90 is peeled off, the protective film 90 is in contact with the ramps, and as a result, the tension applied to the protective film 90 can be reduced as compared to when the first contact portion 111-1 has the same area at both its top and base. The predetermined angle θ formed between the sides of the first contact portion 111-1 and the top surface of the protective film 90 may be 30° to 60°, such as about 45°.

The first contact portion 111-1 may have the shape of a frustum of a cone, and the base of the frustum of the cone may have a circular shape in a plan view. The radius R3 of the circular shape may be 2 mm to 5 mm, such as 3.4 mm, when the display panel 7 is 6 inches long. However, the shape of the first contact portion 111-1 is not particularly limited. For instance, alternatively, the first contact portion 111-1 may have the shape of a frustum of a pyramid, such as a frustum of a pentagonal, hexagonal, heptagonal, or octagonal pyramid.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a display module comprising:
      a non-bending area; and
      a bending area bent from the non-bending area;
   a protective film peelably attached to a bottom surface of the display module, the protection film being configured to be peeled off the bottom surface; and
   a cover member comprising:
      a first contact portion coupled to one area of the protective film;
      a bending protection portion supporting one end of the display module; and
      a connecting portion having one end connected to the first contact portion and another end connected to the bending protection portion,
   wherein a planar shape of the first contact portion comprises a curved edge.

2. The display device of claim 1, wherein the first contact portion comprises a first adhesive layer formed on a first surface thereof.

3. The display device of claim 1, wherein the first contact portion has a circular shape in a plan view.

4. The display device of claim 3, wherein a radius of the circular shape is greater than or equal to 2 mm and less than or equal to 5 mm.

5. The display device of claim 1, wherein the protective film comprises at least one pull tab portion disposed at an upper part of the protective film, the at least one pull tab portion protruding outwardly beyond the display module.

6. The display device of claim 5, wherein:
   the first contact portion has a first area pressurized by a bending part of the protective film formed in response to the protective film being peeled off; and
   the first area has a semicircular shape in a plan view.

7. The display device of claim 6, wherein the first area is disposed to correspond to the pull tab portion.

8. The display device of claim 1, wherein:
   the bending protection portion comprises a non-bending supporting part supporting the non-bending area; and at least one of the non-bending supporting part and the bending protection portion comprises a second adhesive layer.

9. The display device of claim 1, further comprising:
a window member,
wherein the bending protection portion comprises a coupler engaged with one end of the window member.

* * * * *